United States Patent
Yu et al.

(10) Patent No.: US 7,289,372 B1
(45) Date of Patent: Oct. 30, 2007

(54) DUAL-PORT MEMORY ARRAY USING SHARED WRITE DRIVERS AND READ SENSE AMPLIFIERS

(75) Inventors: Haiming Yu, San Jose, CA (US); Wei Yee Koay, Penang (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/502,817

(22) Filed: Aug. 11, 2006

Related U.S. Application Data (62) Division of application No. 10/928,589, filed on Aug. 26, 2004, now Pat. No. 7,110,304.

(51) Int. Cl.
*G11C 7/10* (2006.01)

(52) U.S. Cl. .......................... 365/189.01; 365/189.04; 365/189.03; 365/189.08; 365/220; 365/202; 365/230.05; 365/230.06

(58) Field of Classification Search ........... 365/189.01, 365/189.03, 189.04, 189.08, 220, 202, 230.05, 365/230.06
See application file for complete search history.

(56) References Cited

U.S. PATENT DOCUMENTS

| | | |
|---|---|---|
| 4,745,579 A | 5/1988 | Mead et al. |
| 4,979,145 A | 12/1990 | Remington et al. |
| 5,276,842 A | 1/1994 | Sugita |
| 5,388,072 A | 2/1995 | Matick et al. |
| 5,396,464 A | 3/1995 | Slemmer |
| 5,544,095 A | 8/1996 | Longway et al. |
| 5,640,534 A | 6/1997 | Liu et al. |
| 5,781,496 A | 7/1998 | Pinkham et al. |
| 5,787,041 A | 7/1998 | Hill et al. |
| 5,847,998 A | 12/1998 | Van Buskirk |
| 5,978,307 A | 11/1999 | Proebsting et al. |
| 6,011,730 A | 1/2000 | Sample et al. |
| 6,065,092 A | 5/2000 | Roy |
| 6,084,819 A | 7/2000 | Kablanian |
| 6,097,640 A | 8/2000 | Fei et al. |
| 6,104,642 A | 8/2000 | Blomgren et al. |
| 6,157,560 A | 12/2000 | Zheng |
| 6,314,047 B1 | 11/2001 | Keay et al. |
| 6,339,539 B1 | 1/2002 | Gibson et al. |
| 6,370,073 B2 | 4/2002 | Leung |

(Continued)

OTHER PUBLICATIONS

"On-Chip Memory Implementations Using Cyclone Memory Blocks," product technical information from Altera Corporation San Jose, CA (May 2003).

(Continued)

*Primary Examiner*—Viet Q. Nguyen
(74) *Attorney, Agent, or Firm*—Townsend and Townsend and Crew LLP (57) ABSTRACT

Dual port memory blocks that have a reduced layout area are provided. The write drivers and sense amplifiers are shared between the dual ports to reduce the number of write drivers and sense amplifiers to save layout area. The write drivers for the two ports are used to write into all of the first port's bitlines. The sense amplifiers for the two ports are used to read from all of the second port's bitlines. A memory block can to support true dual port (TDP) and simple dual port (SDP) operation using substantially less write drivers and sense amplifiers.

20 Claims, 6 Drawing Sheets

U.S. PATENT DOCUMENTS

| | | |
|---|---|---|
| 6,373,752 B1 | 4/2002 | Wright et al. |
| 6,418,067 B1 | 7/2002 | Watanabe et al. |
| 6,421,294 B2 * | 7/2002 | Hidaka .................. 365/230.03 |
| 6,434,079 B2 | 8/2002 | Kim |
| 6,467,017 B1 | 10/2002 | Ngai et al. |
| 6,515,920 B2 | 2/2003 | Nakano et al. |
| 6,519,202 B1 | 2/2003 | Shubat et al. |
| 6,556,502 B2 | 4/2003 | Ngal et al. |
| 6,661,733 B1 | 12/2003 | Pan et al. |
| 6,735,727 B1 | 5/2004 | Lee |
| 6,829,682 B2 | 12/2004 | Kirihata et al. |
| 6,845,059 B1 | 1/2005 | Wordeman et al. |
| 7,110,304 B1 * | 9/2006 | Yu et al. ................ 365/189.02 |
| 2001/0019512 A1 * | 9/2001 | Hidaka .................. 365/230.03 |

OTHER PUBLICATIONS

"Stratix Architecture," product technical information from Altera Corporation San Jose, CA (Nov. 2003).

* cited by examiner

DUAL-PORT MEMORY ARRAY USING SHARED WRITE DRIVERS AND READ SENSE AMPLIFIERS

CROSS-REFERENCES TO RELATED APPLICATIONS

This application is a divisional application of U.S. patent application Ser. No. 10/928,589 filed Aug. 26, 2004, entitled "DUAL PORT MEMORY ARRAY USING SHARED WRITE DRIVERS AND READ SENSE AMPLIFIERS," now U.S. Pat. No. 7,110,309 the entire disclosure of which is incorporated by reference for all purposes.

BACKGROUND OF THE INVENTION

This invention relates to dual port memory circuits, and more particularly, to dual port memory circuits that have shared write drivers and sense amplifiers.

A configurable memory block in field programmable gate array (FPGA) is usually built to support various read and write operation modes, such as true dual port (TDP), simple dual port (SDP), and single port (SP) modes. The operation mode is configured depending on the user application. A TDP memory supports two write operations, one read and one write operation, or two read operations at one time.

A typical dual port memory has two independent input and output data paths and address decoders. A dual port memory block also has two independent write bitline drivers and two independent sense amplifiers that support two simultaneous write or two simultaneous read operations on a single column of memory cells. A SDP memory supports one read and one write operation at the same time. A SDP memory can be built from a TDP memory by using one port to write and the other port to read.

The number of input and output paths of a configurable memory block in a FPGA fabric is fixed. The maximum data width that can be supported in different operation mode varies. For example, if the number of the input and output paths for a memory block is 36 each, the maximum data width that can be supported in TDP mode is 18 bits, and the maximum data width that can be supported in SDP mode is 36 bits. Hence, a configurable memory in a FPGA fabric often supports an N-bit data width for TDP mode, and 2N-bit data width for SDP mode to fully utilize the available input/output path resources.

A typical configurable memory block that supports N-bit TDP and 2N-bit SDP modes includes an input/output path with input and output registers, and other logics to control the input and output data path. Two independent column decoders, called Port A and Port B column decoders, are used for TDP and SDP mode operation. The Port A column decoder controls which column of memory cells to access through Port A decoded from the Port A column address. The Port B column decoder controls which column of memory cells to access through Port B decoded from the Port B column address.

A width decoder decodes the configurable input and output data width to the memory array. Together with the column decoder, the input and output data is mapped to the correct memory column. A sense amplifier block includes precharge circuitry and the actual sense amplifiers. The differential bitlines are pre-charged to a high value before read. During evaluation, one of the differential bitlines starts to discharge. The sense amplifier senses and amplifies the differential voltage.

Write driver circuitry includes the tri-state write drivers with other write control logic. Two independent row decoders (for Port A and Port B) are used to control which row of memory cells to access for each port. The memory array is organized as M rows×36 columns of dual port RAM cells.

Each column of the RAM cells is accessible through a Port A write driver, a Port B write driver, a Port A sense amplifier, a Port B sense amplifier, and the Port A and Port B column and row decoder. Each port has 36 write drivers and 36 sense amplifiers to access 36 bitlines associated with each port. Hence, there are total of 72 write drivers and 72 sense amplifiers in one memory block.

When the memory block is configured in TDP, the maximum data width is 18 bits for each port. 18 out of the 36 input paths are used for the Port A input data, and the other 18 input paths are used for the Port B input data. The 18-bit input data for each port is fed to 18 of the 36 write drivers for each port. Only 18 out of the 36 write drivers for each port are enabled at one time during a write operation. For the output path, 18 out of the 36 outputs are used for Port A output data, and the other 18 outputs are used for Port B output data. Only 18 out of the 36 sense amplifiers are enabled for each port during read.

When the memory block is configured in SDP mode, the maximum data width is 36 bits. Port A is always used as the write port, and Port B is always used as the read port. A maximum of 36 bits of data is written to the RAM array through the 36 Port A write drivers. Writing in SDP is only done through the Port A bitlines. Port B write drivers are always disabled in this mode. 36-bit data is read from the array through the 36 Port B sense amplifiers. Reading in SDP is only done through Port B bitlines. Port A sense amplifiers are always disabled in this mode.

There are total 72 write drivers and 72 sense amplifiers in this design. The write drivers and sense amplifiers are usually large devices that occupy large layout area that make the bit per area density number larger. The overhead becomes more significant for a chip that is area or cost sensitive. Although there are 72 write drivers and 72 sense amplifiers in this design, only as many as 36 write drivers and 36 sense amplifiers are active at any time during a read or write operation. In TDP mode, up to 18 Port A write drivers, 18 Port B write drivers, 18 Port A sense amplifiers, and 18 Port B sense amplifiers are active. In SDP mode, up to 36 Port A write drivers and 36 Port B sense amplifiers are active.

Therefore, there is a need to provide dual port memory blocks that provide TDP and SDP operation that has a reduced layout area overhead.

BRIEF SUMMARY OF THE INVENTION

The present invention provides dual port memory blocks that have a reduced layout area overhead. The write drivers and sense amplifiers are shared between the dual ports to reduce the number of write drivers and sense amplifiers to save layout area.

The write drivers for the two ports are used to write into all of the first port's bitlines. The sense amplifiers for the two ports are used to read from all of the second port's bitlines. The techniques of the present invention allow a memory block to support true dual port (TDP) and simple dual port (SDP) operation using substantially less write drivers and sense amplifiers.

Other objects, features, and advantages of the present invention will become apparent upon consideration of the following detailed description and the accompanying drawings, in which like reference designations represent like features throughout the figures.

DETAILED DESCRIPTION OF THE INVENTION

Figure 1:
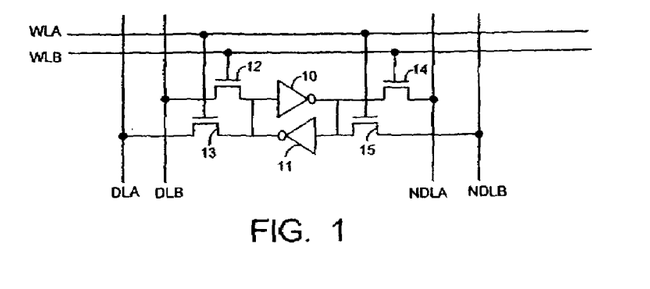
FIG. 1 illustrates an example of a typical SRAM memory cell.

FIG. 1 illustrates an example of a typical static random access memory (SRAM) cell. The SRAM cell includes cross coupled inverters 10 and 11 and pass transistors 12-15. Inverters 10 and 11 store a bit of digital data. Pass transistors 12-15 control access to inverters 10-11 from word lines for ports A and B (WLA and WLB) and from the differential bitlines for ports A and B (DLA, DLB, NDLA and NDLB).

Figure 2:
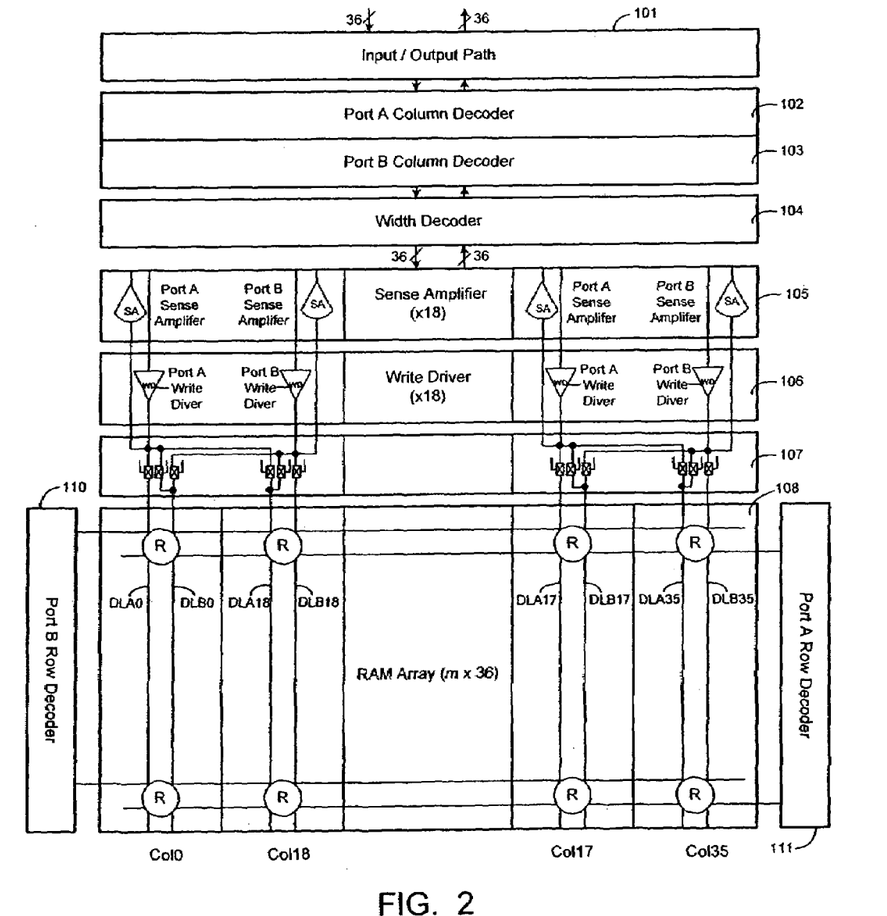
FIG. 2 illustrates dual port memory block according to a first embodiment of the present invention.

FIG. 2 illustrates a dual port memory block according to a first embodiment of the present invention. The dual port memory block includes an input/output data path 101 that receives input and output data. The example shown in FIG. 2 includes 36 data input lines and 36 data output lines. The dual port memory block also includes a column decoder 102 for port A, a column decoder 103 for port B, a width decoder 104, a block 105 of sense amplifiers, a block 106 of write drivers, multiplexers 107, an array 108 of memory cells, a row decoder 110 for port B, and a row decoder 111 for port A.

The memory cells can be SRAM cells as shown in FIG. 1 or EEPROMs, FLASH, or other suitable types of memory cells. Sense amplifier block 105 includes Port A sense amplifiers and Port B sense amplifiers. Write driver block 106 includes Port A write drivers and Port B write drivers.

In the example shown in FIG. 2, block 105 has 36 sense amplifiers that are fed to 36 columns of RAM array 108 through multiplexers 107. The memory block includes 18 sense amplifiers associated with Port A, and 18 sense amplifiers that are associated with Port B.

Port A sense amplifiers can read data from Port A bitlines of two adjacent columns of memory during TDP mode operation. Port A sense amplifiers can also read data from Port B bitlines of the first column during SDP mode operation. Port B sense amplifiers can read data from Port B bitlines of two adjacent columns during TDP Mode operation. Port B sense amplifiers can also read data from Port B bit lines of the second column during SDP mode operation.

Block 106 has 36 write drivers that feed into 36 columns of the memory array. 18 write drivers are associated with Port A, and 18 write drivers are associated with Port B. Memory blocks of the present invention have N columns of memory cells, N sense amplifiers, and N write drivers. Although 36 sense amplifiers, 36 write drivers, and 36 columns of memory cells are shown in the example of FIG. 2, it should be understood that any number N of write drivers, sense amplifiers, and columns of memory cells can be used with the present invention.

Port A write drivers can write data to Port A bitlines of two adjacent columns during TDP mode. Port A write drivers can also write data to Port A bitlines of the first column during SDP mode. Port B write drivers can write data to Port B bitlines of two adjacent columns during TDP mode. Port B write drivers can also write data to Port A bitlines of the second column during SDP mode operation.

Multiplexers 107 connect write drivers 106 and sense amplifiers 105 to the correct RAM array column and input/output port. The memory array 108 is arranged as M rows×36 columns.

In the embodiment of FIG. 2, there are only 18 columns of write drivers and 18 columns of sense amplifiers for each port. The total number of write drivers is 36, and the total number of sense amplifiers is 36. Prior art dual port memories had 72 write drivers and 72 sense amplifiers for a memory array of the same size. In a typical prior art design, a write driver and sense amplifier of a particular column can only access the bitline of their own column and port (e.g. Column 0 Port A write driver and sense amplifier can only access column 0 Port A bitline).

In contrast, each write driver and sense amplifier in FIG. 2 can access the same port of the adjacent column or the other port of the same column depending on the operation mode configured. This is implemented by adding multiplexers in block 107 between the write drivers 106 and the memory array 108. The multiplexers add extra area to the design, but the additional area is small compared to the area saved by reducing the number of write drivers and sense amplifiers in blocks 105-106. Moreover, the extra multiplexers in block 107 are shared by both write drivers and sense amplifiers to access to the memory array.

Each column of write drivers and sense amplifiers is shared by two columns of memory cells. In the embodiment of FIG. 2, the columns of memory cells are organized in an alternating order 0, 18, 1, 19, 2, 20 . . . 16, 34, 17, 35 so that each write bitline driver/sense amplifier column can access the respective least significant bit (LSB) and most significant bit (MSB) more easily.

During TDP mode operation, each write driver or sense amplifier can access two memory columns from its own port. The multiplexers in block 107 serve as a second stage column decoder to write or read the data for each port. The MSB bit of the column address of each port generates a control signal that determines which column will be accessed during the read write operation. During SDP, both Port A and Port B write drivers and sense amplifiers are used at the same time to access the whole 36-bit data from the memory array. The details of the data path and the control mechanism of the read and write process are explained below with respect to FIG. 3.

Figure 3:
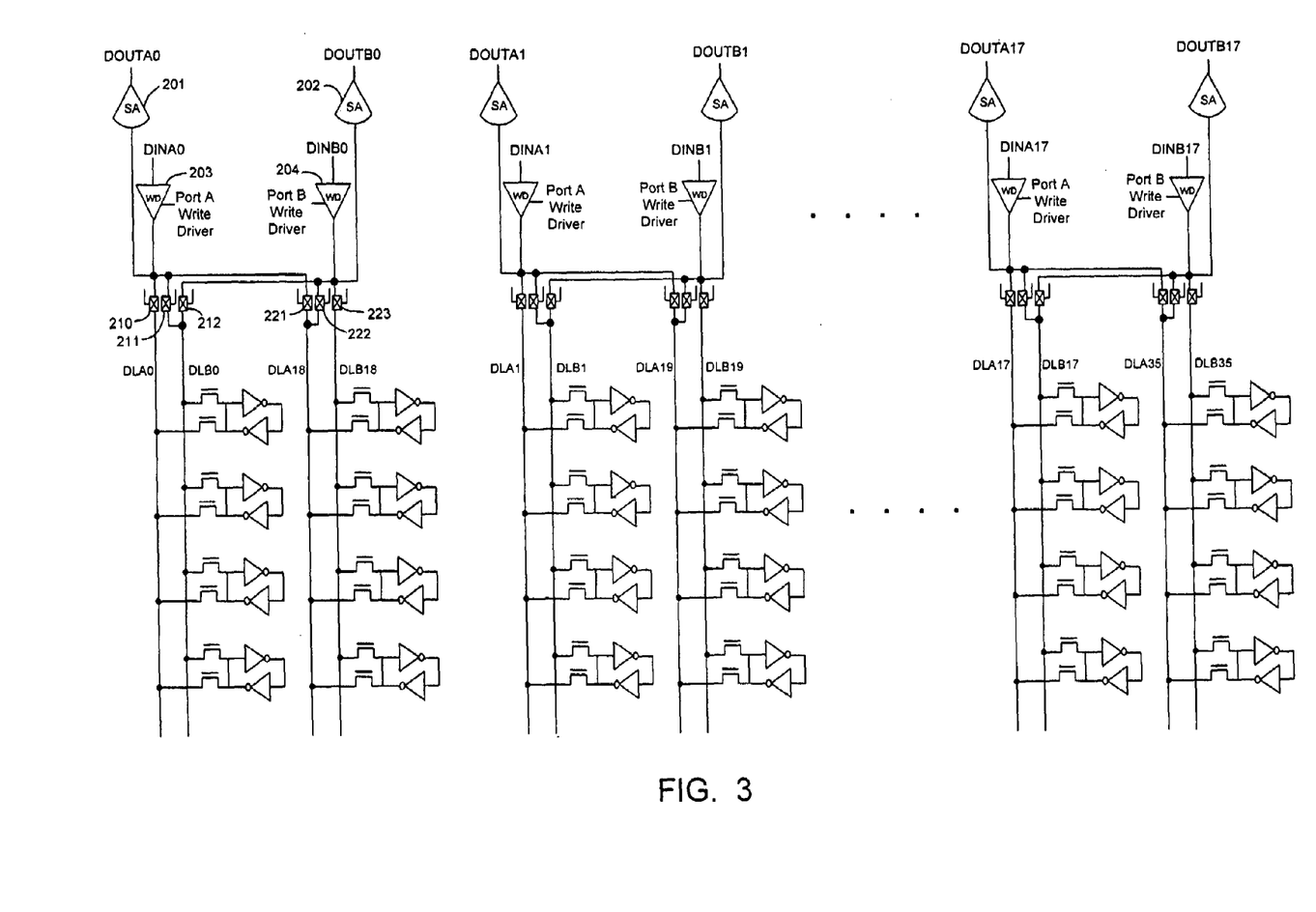
FIG. 3 illustrates sense amplifiers, write drivers, and multiplexers for selected columns of memory cells according to an embodiment of a memory array of the present invention.

FIG. 3 illustrates write drivers such as drivers 203-204 that are used to write data bits into the memory cells, and sense amplifiers such as amplifiers 201-202 that amplify the output signals of the memory cells. The memory blocks of FIGS. 2 and 3 have 36 sense amplifiers and 36 write drivers that are connected to 36 columns of memory cells through multiplexer block 107.

Block 107 includes tristate drivers coupled to Port A and Port B bitlines for each column of memory cells. For example, tristate drivers 210-212 are coupled to bitlines DLA0 and DLB0, and tristate drivers 221-223 are coupled to bitlines DLA18 and DLB18.

The tristate drivers are controlled by the column address signals. When the column address signals select memory cell columns 0-17, tristate driver 210 couples Port A write driver 203 to bitline DLA0, and tristate driver 212 couples Port B write driver 204 to bitline DLB0. When the column address signals select memory cell columns 18-35, tristate driver 221 couples Port A write driver 203 to bitline DLA18, and tristate driver 223 couples Port B write driver 204 to bitline DLB18.

Figure 4A:
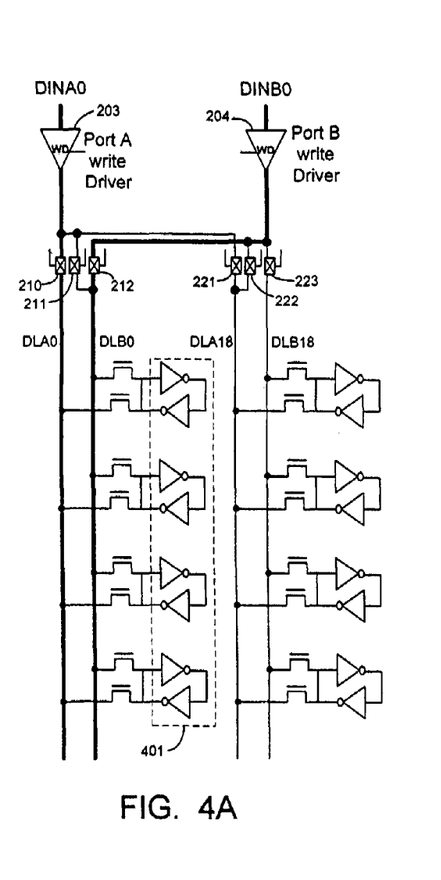
FIGS. 4A-4C illustrate write operations in TDP and SDP modes in a memory block of the present invention.
Figure 4B:
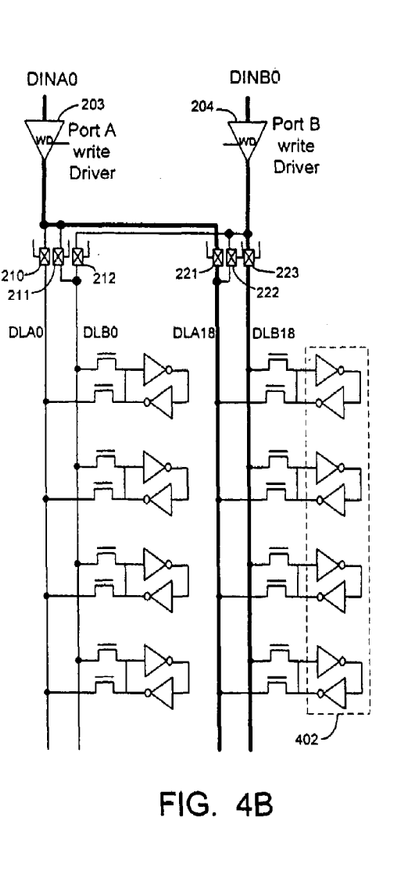

Further details of true dual port (TDP) mode and simple dual port (SDP) mode are now discussed with respect to FIGS. 4A-4C and 5A-5C. FIGS. 4A and 4B illustrate write operations in TDP mode for 2 of the columns of memory cells 401-402. During TDP mode, each Port A write driver has access to two columns of Port A bitlines, and each Port B write driver has access to two columns of Port B bitlines.

As shown by the bolded lines in FIG. 4A, tristate driver 210 couples Port A write driver 203 to bitline DLA0 in response to a selected Port A column address. Tristate driver 212 couples Port B write driver 204 to bitline DLB0 in response a selected Port B column address. Bitlines DLA0 and DLB0 are both coupled to memory cell column 401. Therefore, write drivers 203 and 204 are able to write data to column 401 in TDP mode.

As shown by the bolded lines in FIG. 4B, tristate driver 221 couples Port A write driver 203 to bitline DLA18 in response to a selected Port A column address. Tristate driver 223 couples Port B write driver 204 to bitline DLB18 in response to a selected Port B column address. Bitlines DLA18 and DLB18 are both coupled to memory cell column 402. Thus, write drivers 203-204 are able to write data to column 402 in TDP mode. 18-bit data from Port A and 18-bit data from Port B can be written to the memory array at any time during TDP Mode.

During SDP operation, Port A write bitline drivers access 18-bit LSB data and Port B write bitline drivers access 18-bit MSB data at the same time. Port B inputs DINB[17:0] are used for data input bits DIN[35:18], and Port A inputs DINA[17:0] are used for data input bits DIN[17:0] during SDP mode. The write operation only goes through Port A bitlines. The Port A drivers are used to write the first half (LSB) of the memory array, and the Port B write bitline drivers are used to write to the second half (MSB) of the memory array. 36-bit data can be written during the SDP operation.

Figure 4C:
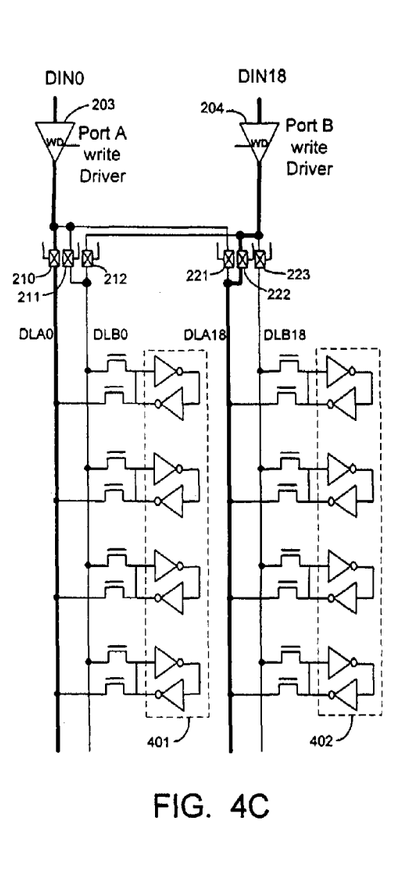

FIG. 4C illustrates write operations in SDP mode for memory cells columns 401-402. Tristate driver 210 couples Port A write driver 203 to bitline DLA0 in response to a selected Port A column address. Tristate driver 222 couples Port B write driver 204 to bitline DLA18 in response to a selected Port B column address. The bolded lines in FIG. 4C illustrate these connections. Thus, write drivers 203-204 are able to write data to columns 401-402, respectively, in SDP mode.

Figure 5A:
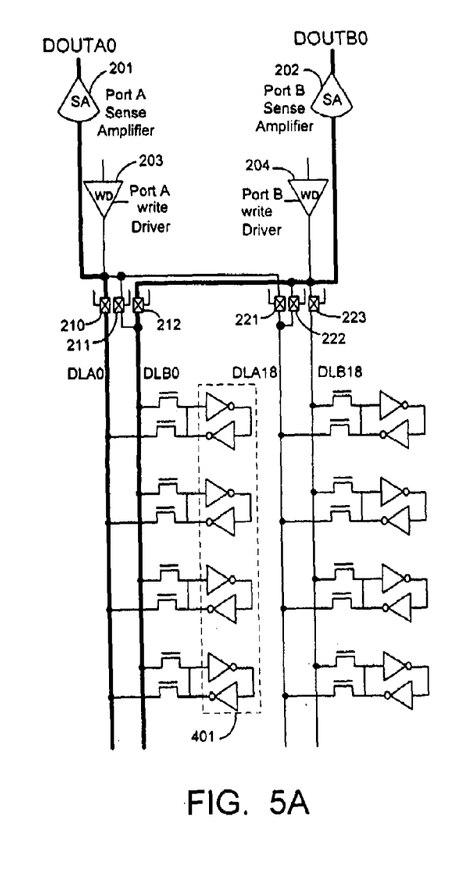
FIGS. 5A-5C illustrate read operations in TDP and SDP modes in a memory block of the present invention.
Figure 5B:
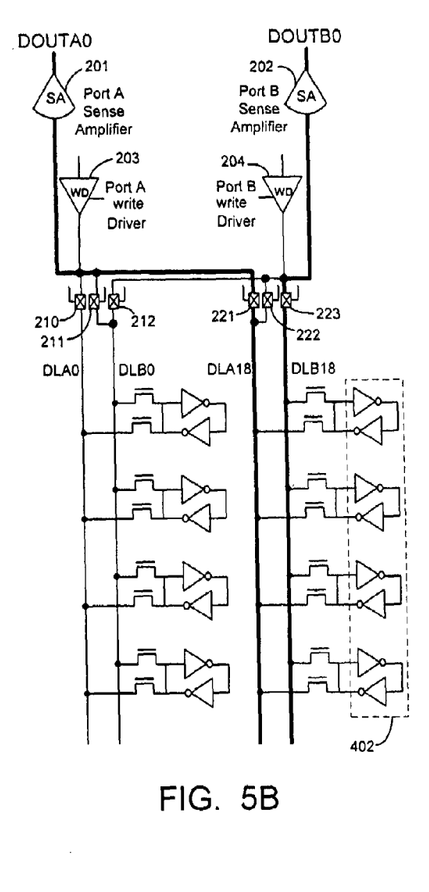

FIGS. 5A and 5B illustrate read operations in TDP mode for memory cells columns 401-402. During TDP mode, each Port A sense amplifier has access to two columns of Port A bitlines, and each Port B sense amplifier has access to two columns of Port B bitlines.

During TDP mode, each Port A sense amplifier can access one of the two Port A bitlines, and each Port B sense amplifier can access one of the two Port B bitlines depending on the Port A and Port B column address. When the column address signals select memory cell columns 0-17, Port A sense amplifier 201 reads out data from bitline DLA0 through tristate driver 210, and Port B sense amplifier 202 can read out data from bitline DLB0 through tristate driver 212 as shown by the bolded lines in FIG. 5A.

When the column address signals select memory cell columns 18-35, Port A sense amplifier 201 reads out data from bitline DLA18 through tristate driver 221, and Port B sense amplifier 202 reads out data from bitline DLB18 through tristate driver 223 as shown by the bolded lines in FIG. 5B. 18-bit data from Port A and 18-bit data from Port B can be read from the memory array at any time during TDP Mode.

Figure 5C:
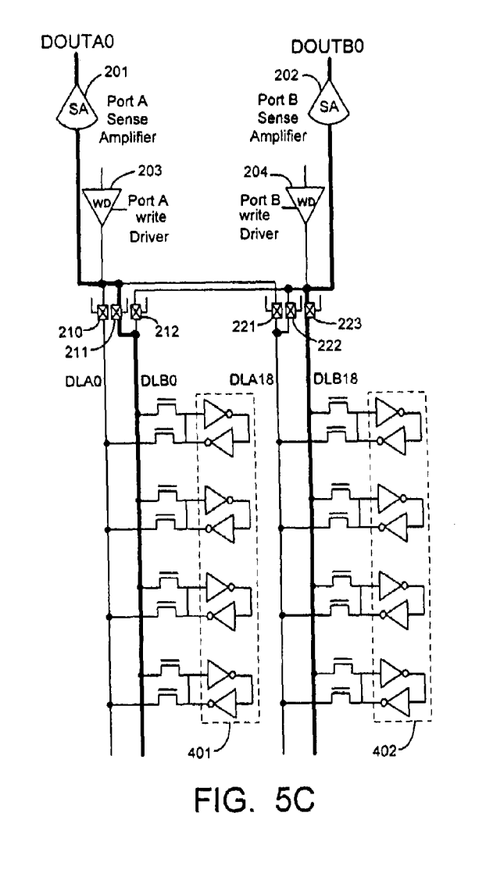

FIG. 5C illustrates read operations in SDP mode for memory cell columns 401-402. During SDP operation, Port A sense amplifiers read the 18-bit LSB data, and Port B sense amplifiers read the 18-bit MSB data. Sense amplifier outputs DOUTB [17:0] serve as data output bits DOUT[35:18], and sense amplifier outputs DOUTA[17:0] serve as data output bits DOUT[17:0] during SDP mode. For example, Port A sense amplifier 201 reads data from bitline DLB0 through tristate driver 211, and Port B sense amplifier 202 reads data from bitline DLB18 through tristate driver 223 as shown by the bolded lines in FIG. 5C.

The read operation during SDP mode only goes through Port B bitlines. Port A sense amplifiers are used to read the first half (LSB) of the memory array through Port B bitlines, and Port B sense amplifiers are used to read from the second half (MSB) of the memory array through Port B bitlines. 36-bit data can be read at any time during the SDP operation.

Figure 6:
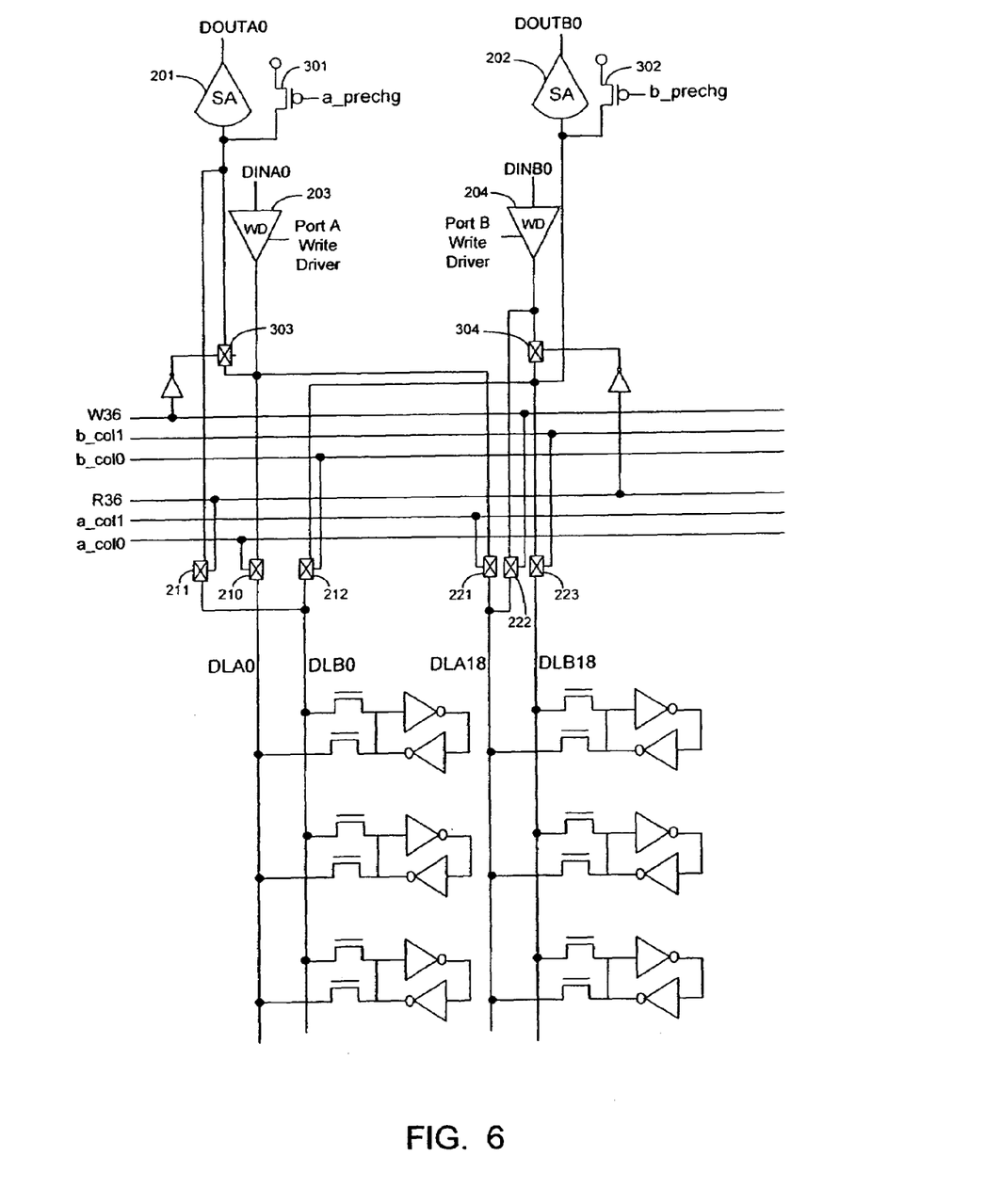
FIG. 6 illustrates the signals that control the multiplexers and the precharge circuitry in a memory array, according to an embodiment of the present invention.

The control signals that control the multiplexers during write and read operation are now discussed. FIG. 6 shows the signals that control the multiplexers for memory cell columns 0 and 18. The multiplexer control signals for columns 0 and 18 include signals R36 and a_col0, a_col1, W36, b_col0, and b_col1. The multiplexers for the other columns of memory cells have corresponding control signals. Signals R36 and W36 are set to '1' only when the memory is configured as a 36-bit width memory in SDP mode. Otherwise, signals R36 and W36 are both set to '0'.

The precharge signals a_prechg and b_prechg are generated by the read/write control logic (not shown). Precharge signals a_prechg and b_prechg are only set to '1' during pre-charge operation for each port. When a_prechg signal is '1' and both a_col0 and a_col1 signals are set to '1', the Port A pre-charge transistor 301 can pre-charge both DLA0 and DLA18. When b_prechg signal is '1', both b_col0 and b_col1 are set to '1', so that the Port B pre-charge transistor 302 can pre-charge both DLB0 and DLB18. This pre-charge scheme is used for both TDP and SDP operation. One pre-charge circuit is always used to pre-charge two columns of bitlines of its own port.

Except during the pre-charge operation, each write bitline driver and each sense amplifier selectively access only one bitline. When W36 is set to '0' for TDP mode, the a_col1 signal and the a_col1 signal depend on the MSB bit of the Port A column address acol[MSB]. If acol[MSB] is '0', the a_col0 signal is set to '1', and the a_col1 signal is set to '0' so that the Port A write driver or sense amplifier can access bitline DLA0 through tristate driver 210. If acol[MSB] is '1', the a_col0 signal is set to '0', and the a_col1 signal is set to '1' so that the Port A write driver or sense amplifier can access DLA18 through tristate driver 221.

The same concept applies to the Port B operation. When R36 is set to '0' for TDP mode, the b_col0 and b_col1 signals depend on the MSB bit of the Port B column address bcol[MSB]. If bcol[MSB] is '0', the b_col0 signal is set to '1', and the b_col1 signal is set to '0' so that the Port B write driver or sense amplifier can access bitline DLB0 through tristate driver 212. If bcol[MSB] is '1', the b_col0 signal is set to '0', and the b_col1 signal is set to '1' so that the Port B write driver or sense amplifier can access DLB18 through tristate driver 223.

If the W36 and R36 signals are both set to '1' for SDP mode, the a_col[1:0] and b_col[1:0] signals do not depend on the column address. The a_col0 signal is set to '1' so that the Port A write driver 203 can access bitline DLA0 through tristate driver 210. When signal a_col0 is set to '0' and W36 is '1', Port B write driver 204 has access to bitline DLA18 through tristate driver 222.

When signal b_col0 is set to '0' to and R36 set to '1', Port A sense amplifier 201 has access to bitline DLB0 through tristate driver 211. When signal b_col1 is set to '1', Port B sense amplifier 202 as access to bitline DLB18 through tristate driver 223. Pass gates 303-304 are added to solve contention in the data path during SDP operation. Table 1 below is a truth table that generates the multiplexer control signals a_col0, a_col1, b_col0, and b_col1.

TABLE 1

| a_prechg | W36 | acol[MSB] | a_col0 | a_col1 |
|---|---|---|---|---|
| 1 | X | X | 1 | 1 |
| 0 | 0 | 0 | 1 | 0 |
| 0 | 0 | 1 | 0 | 1 |
| 0 | 1 | X | 1 | 0 |

| b_prechg | R36 | bcol(MSB) | b_col0 | b_col1 |
|---|---|---|---|---|
| 1 | X | X | 1 | 1 |
| 0 | 0 | 0 | 1 | 0 |
| 0 | 0 | 1 | 0 | 1 |
| 0 | 1 | X | 0 | 1 |

A configurable memory of the present invention is designed to support various operating modes such as TDP and SDP modes and the maximum data width allowed by the input and output resources. The techniques of the present invention require half the write drivers and sense amplifiers required by many prior art dual port memory blocks. Saving half of the write drivers and sense amplifiers results in a significant area savings, because the write drivers and sense amplifiers are usually made to have a large area for higher performance.

The present invention also requires half of the column decoder and width decoder circuitry, because the number of write and read logic columns is reduced by half, saving some additional area. A configurable 4 K-bit memory design using the techniques of the present invention can achieve up to 10% area saving compared to prior art designs. A memory of the present invention can also save standby power, because the number of write drivers and sense amplifiers is reduced by half.

Figure 7:
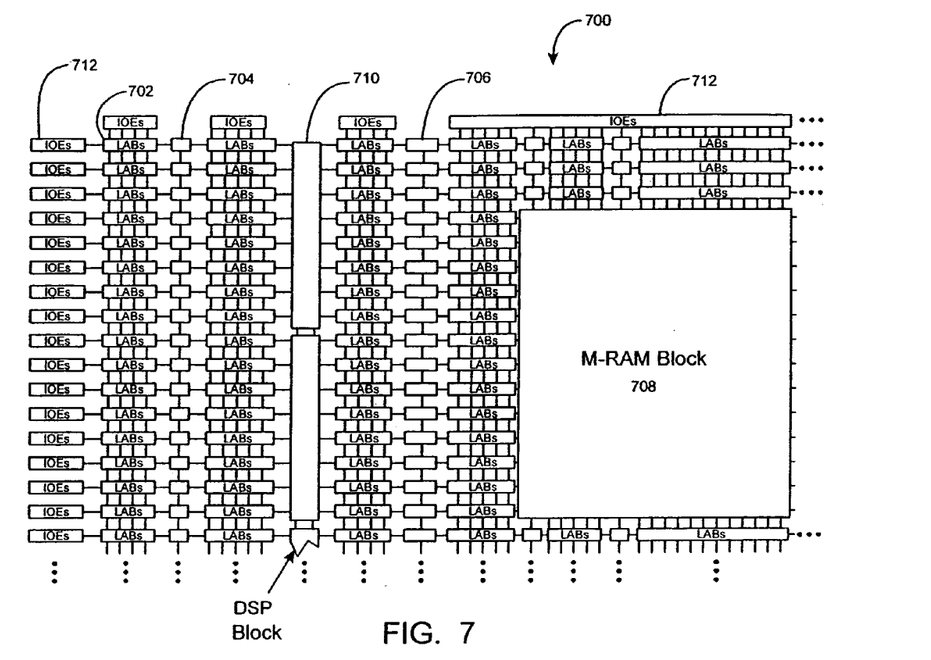
FIG. 7 is a simplified block diagram of a programmable logic device that can be used with the techniques of the present invention.

FIG. 7 is a simplified partial block diagram of an example of a PLD 700. PLD 700 is an example of a programmable logic integrated circuit in which a memory block of the present invention can be placed. It should also be understood that the present invention can be implemented in numerous types of integrated circuits other than programmable logic integrated circuits such as field programmable gate arrays (FPGAs) and programmable logic arrays. PLD 700 includes a two-dimensional array of programmable logic array blocks (or LABs) 702 that are interconnected by a network of column and row interconnects of varying length and speed. LABs 702 include multiple (e.g., 10) logic elements (or LEs).

An LE is a programmable logic block that provides for efficient implementation of user defined logic functions. PLD 700 has numerous logic elements that can be configured to implement various combinatorial and sequential functions. The logic elements have access to a programmable interconnect structure. The programmable interconnect structure can be programmed to interconnect the logic elements in almost any desired configuration.

PLD 700 also includes a distributed memory structure including RAM blocks of varying sizes provided throughout the array. The RAM blocks include, for example, 512 bit blocks 704, 4 K blocks 706 and a block 708 that provides 512 K bits of RAM. These memory blocks can also include shift registers and FIFO buffers.

PLD 700 further includes digital signal processing (DSP) blocks 710 that can implement, for example, multipliers with add or subtract features. I/O elements (IOEs) 712 located, in this example, around the periphery of the device support numerous single-ended and differential I/O standards. It is to be understood that PLD 700 is described herein for illustrative purposes only and that the present invention can be evaluate many different types of PLDs, FPGAs, and the like.

Figure 8:
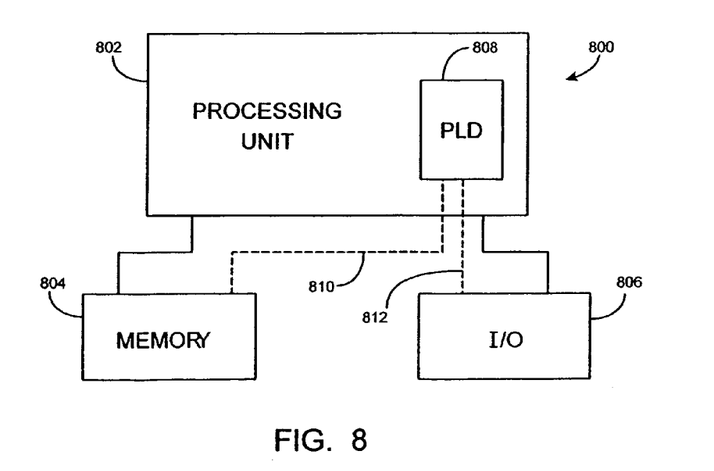
FIG. 8 is a block diagram of an electronic system that can implement embodiments of the present invention.

While PLDs of the type shown in FIG. 7 provide many of the resources required to implement system level solutions, the present invention can also benefit systems wherein a PLD is one of several components. FIG. 8 shows a block diagram of an exemplary digital system 800, for which the present invention can be implemented. System 800 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 800 can be provided on a single board, on multiple boards, or within multiple enclosures.

System 800 includes a processing unit 802, a memory unit 804 and an I/O unit 806 interconnected together by one or more buses. According to this exemplary embodiment, a programmable logic device (PLD) 808 is embedded in processing unit 802. PLD 808 can serve many different purposes within the system in FIG. 8. PLD 808 can, for example, be a logical building block of processing unit 802, supporting its internal and external operations. PLD 808 is programmed to implement the logical functions necessary to carry on its particular role in system operation. PLD 808 can be specially coupled to memory 804 through connection 810 and to I/O unit 806 through connection 812.

Processing unit 802 can direct data to an appropriate system component for processing or storage, execute a program stored in memory 804 or receive and transmit data via I/O unit 806, or other similar function. Processing unit 802 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 808 can control the logical operations of the system. In an embodiment, PLD 808 acts as a reconfigurable processor, which can be reprogrammed as needed to handle a particular computing task. Alternately, programmable logic device 808 can itself include an embedded microprocessor. Memory unit 804 can be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiments disclosed, but that the invention will include all embodiments and equivalents falling within the scope of the claims.

What is claimed is:

1. A method for storing data in a dual port memory circuit that has first and second ports and N columns of memory cells, the method comprising:
   storing N data bits in the N columns of memory cells using a first N/2 write drivers coupled to receive data from the first port and a second N/2 write drivers coupled to receive data from the second port during a simple dual port operation, wherein the memory circuit has no more than N write drivers;
   storing a first N/2 data bits in a first half of the N columns of memory cells using the first N/2 write drivers during a true dual port operation; and
   storing a second N/2 data bits in the first half of the N columns of memory cells using the second N/2 write drivers during the true dual port operation.

2. The method according to claim 1, further comprising:
   storing a third N/2 data bits in a second half of the N columns of memory cells using the first N/2 write drivers during an other true dual port operation; and
   storing a fourth N/2 data bits in the second half of the N columns of memory cells using the second N/2 write drivers during the other true dual port operation.

3. The method according to claim 1, further comprising:
   reading N data bits from the N columns of memory cells using a first N/2 sense amplifiers coupled to transmit data to the first port and a second N/2 sense amplifiers coupled to transmit data to the second port during a simple dual port mode of operation, wherein the memory circuit has no more than N sense amplifiers;
   reading N/2 data bits from a first half of the N columns of memory cells using the first N/2 sense amplifiers during a true dual port mode of operation; and
   reading another N/2 data bits from the first half of the N columns of memory cells using the second N/2 sense amplifiers during the true dual port mode of operation.

4. The method according to claim 1, wherein storing the data bits in the columns of memory cells during the simple dual port mode further comprises coupling each of the write drivers to one of the N columns of memory cells through a multiplexer.

5. The method according to claim 4, wherein storing the data bits in the columns of memory cells during the true dual port mode further comprises coupling each of the write drivers to a first or a second one of the N memory cell columns through a multiplexer.

6. The method according to claim 5, wherein each of the multiplexers selectively couples two write drivers to two bitlines that are coupled to one of the memory cell columns.

7. The method according to claim 6, wherein each of the multiplexers selectively couples two sense amplifiers to two bitlines that are coupled to one of the memory cell columns.

8. The method according to claim 1, wherein each of the multiplexers includes three tristate drivers coupled to bitlines for a column of the memory cells.

9. The method according to claim 1, wherein the dual port memory circuit is part of a programmable logic integrated circuit.

10. The method according to claim 1, wherein during the true dual port operation, one of the first N/2 write drivers is coupled to a first column associated with the 0th bit and a second column associated with the N/2 bit.

11. A method of operating a dual port memory circuit that has first and second ports and N columns of memory cells, the method comprising:
   storing N data bits in the N columns of memory cells using a first N/2 write drivers coupled to receive data from the first port and a second N/2 write drivers coupled to receive data from the second port;
   reading the N data bits from the N columns of memory cells using a first N/2 sense amplifiers coupled to transmit data to the first port and a second N/2 sense amplifiers coupled to transmit data to the second port during a simple dual port mode of operation, wherein the memory circuit has no more than N sense amplifiers;
   reading a first N/2 data bits from a first half of the N columns of memory cells using the first N/2 sense amplifiers during a true dual port operation; and
   reading a second N/2 data bits from the first half of the N columns of memory cells using the second N/2 sense amplifiers during the true dual port operation.

12. The method according to claim 11, further comprising:
   reading a third N/2 data bits from a second half of the N columns of memory cells using the first N/2 sense amplifiers during an other true dual port operation; and
   reading a fourth N/2 data bits from the second half of the N columns of memory cells using the second N/2 sense amplifiers during the other true dual port operation.

13. The method according to claim 11, further comprising:
   storing N data bits in the N columns of memory cells using a first N/2 write drivers coupled to receive data from the first port and a second N/2 write drivers coupled to receive data from the second port during a simple dual port mode of operation, wherein the memory circuit has no more than N write drivers;
   storing N/2 data bits in a first half of the N columns of memory cells using the first N/2 write drivers during a true dual port mode of operation; and
   storing another N/2 data bits in the first half of the N columns of memory cells using the second N/2 write drivers during the true dual port mode of operation.

14. The method according to claim 11, wherein reading the data bits in the columns of memory cells during the simple dual port mode further comprises coupling each of the sense amplifiers to one of the N columns of memory cells through a multiplexer.

15. The method according to claim 14, wherein reading the data bits in the columns of memory cells during the true dual port mode further comprises coupling each of the sense amplifiers to a first or a second one of the N memory cell columns through a multiplexer.

16. The method according to claim 15, wherein each of the multiplexers selectively couples two sense amplifiers to two bitlines that are coupled to one of the memory cell columns.

17. The method according to claim 16, wherein each of the multiplexers selectively couples two write drivers to two bitlines that are coupled to one of the memory cell columns.

18. The method according to claim 11, wherein a sense amplifier uses a first tristate driver during the simple dual port operation, wherein the first tristate driver is not used during the true dual port operation.

19. A method for storing data in a dual port memory circuit that has first and second ports and N columns of memory cells, the method comprising:
   during a simple dual port write operation:
      transmitting N data bits from a first N/2 write drivers and a second N/2 write drivers to N columns of memory cells, wherein the first N/2 write drivers are coupled to the first port, and wherein the second N/2 write drivers are coupled to the second port; and
   during a true dual port write operation:
      transmitting a first N/2 data bits to a first half of the N columns of memory cells from the first N/2 write drivers; and
      transmitting a second N/2 data bits to the first half of the N columns of memory cells using the second N/2 write drivers.

20. The method of claim 19, further comprising:
   during a simple dual port read operation:
      transmitting N data bits from the N columns of memory cells to a first N/2 sense amplifiers and a second N/2 sense amplifiers, wherein the first N/2 sense amplifiers are coupled to the first port, and wherein the second N/2 sense amplifiers are coupled to the second port; and
   during a true dual port read operation:
      transmitting a third N/2 data bits from the first half of the N columns of memory cells to the first N/2 sense amplifiers; and
      transmitting a fourth N/2 data bits from the first half of the N columns of memory cells to the second N/2 sense amplifiers.

* * * * *